United States Patent [19]

Nakashima et al.

[11] Patent Number: 4,831,429
[45] Date of Patent: May 16, 1989

[54] TRANSPARENT PHOTO DETECTOR DEVICE

[75] Inventors: Saburo Nakashima; Shoichiro Nakayama; Shigeru Noguchi; Shoichi Nakano; Yukinori Kuwano, all of Osaka; Kaneo Watanabe, Kyoto; Hiroyuki Kuriyama, Osaka, all of Japan

[73] Assignee: Sanyo Electric Co., Ltd., Japan

[21] Appl. No.: 877,315

[22] Filed: Jun. 23, 1986

[30] Foreign Application Priority Data

| Jun. 27, 1985 | [JP] | Japan | 60-140881 |
| Jun. 28, 1985 | [JP] | Japan | 60-143132 |
| Jun. 28, 1985 | [JP] | Japan | 60-99501[U] |
| Jun. 28, 1985 | [JP] | Japan | 60-99502 |
| May 15, 1986 | [JP] | Japan | 61-111052 |
| May 20, 1986 | [JP] | Japan | 61-75519[U] |

[51] Int. Cl.$^4$ .................................. H01L 27/14
[52] U.S. Cl. ...................... 357/30; 357/68
[58] Field of Search ............ 357/65, 32, 67, 30 H, 357/30 Q, 30 B, 30 D, 30 K, 68, 4, 2, 59 B

[56] References Cited

U.S. PATENT DOCUMENTS 4,678,542  7/1987  Boer et al. .................. 357/4
4,680,085  7/1987  Vijan et al. ................. 357/4

Primary Examiner—William L. Sikes
Assistant Examiner—B. Randolph Holloway
Attorney, Agent, or Firm—Darby & Darby

[57] ABSTRACT

A transparent photo detector device according to an aspect of the present invention comprises: a transparent insulator substrate; a plurality of light sensor elements dispersively disposed on a main surface of the substrate, said sensor element including a transparent front electrode, a semiconductor layer for photo electric function and an opaque back electrode formed in that order on the main surface of the substrate, said semiconductor layer being neither protracting from nor retracting into between said front and back electrodes; and a transparent wire pattern formed on the main surface of the substrate for electrically connecting the plurality of sensor elements.

11 Claims, 11 Drawing Sheets

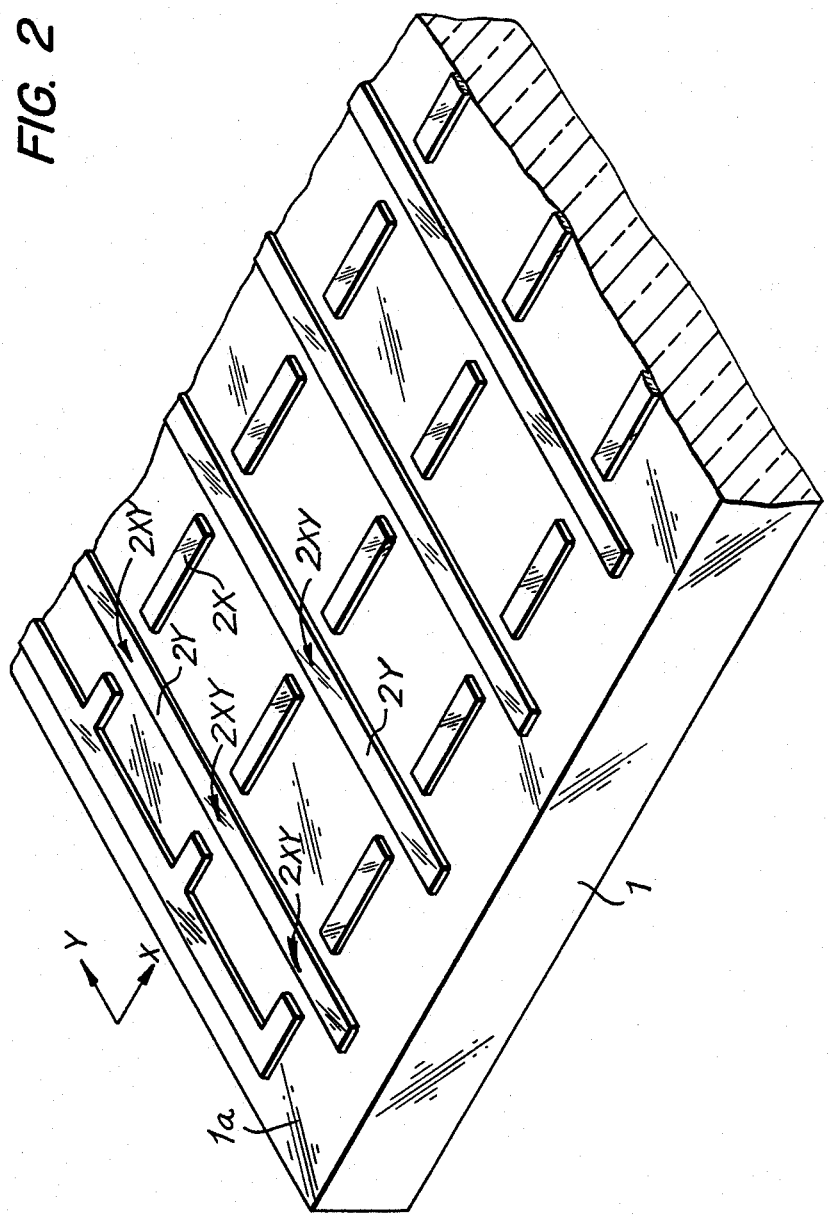

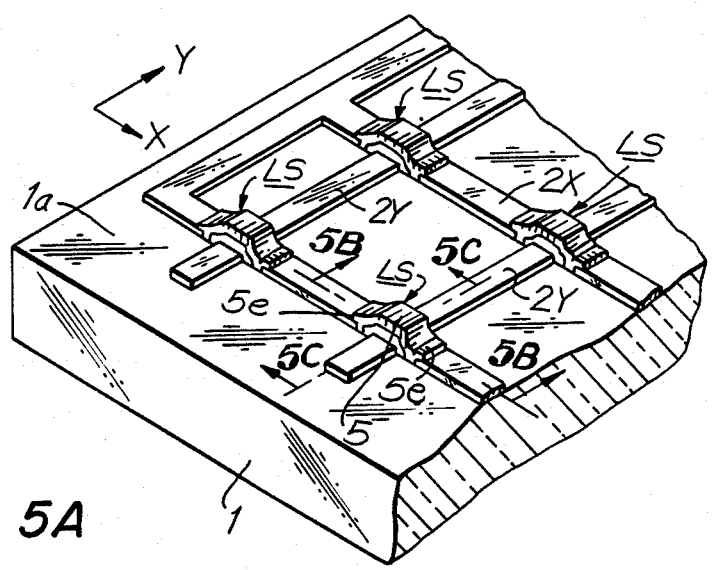
FIG. 5A
FIG. 5B
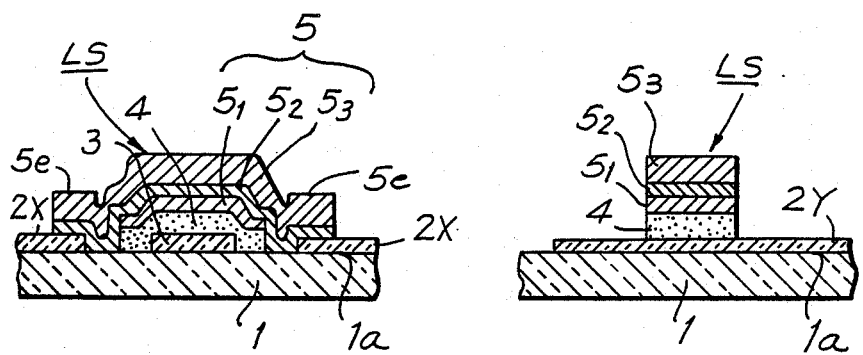
FIG. 5C
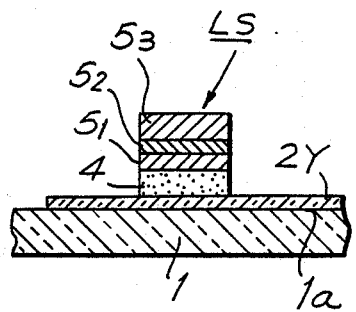

TRANSPARENT PHOTO DETECTOR DEVICE

BACKGROUND OF THE INVENTION

1. Field of the Invention

The present invention relates to a photo detector device for converting optical energy into an electric signal, and particularly to a transparent photo detector device.

2. Description of the Prior Art

Many photo detector devices have been developed for converting light such as visible light or infrared light into an electric signal to obtain an electric signal corresponding to the amount of light. Particularly, a photo detector device using amorphous silicon type semiconductor, which is sensitive to the visible light, as a light sensor element can be formed on a glass substrate, so that it enables an increased semiconductor area, a reduced cost, and simplified manufacturing process. In addition, it has an advantage that it can be finely worked to obtain any pattern by using, e.g., photolithography during the manufacturing process, so that the application field thereof is being enlarged. For example, there are an automatic focus detector device for a camera and a reading device for a facsimile disclosed in the Patent Laying-Open Gazette No. 167002/1982 and the Patent Publication Gazette No. 14073/1983.

A conventional light sensor element is illustrated in FIGS. 1A, 1B and 1C. FIG. 1A is a rear perspective view of the sensor element; FIG. 1B is a cross sectional view taken along the line 1B—1B in FIG. 1A; and FIG. 1C is a cross sectional view taken along the line 1C—1C in FIG. 1A. Referring to these figures, a light sensor element LS is formed of a transparent front electrode 3 on a main surface 1a of a transparent insulator substrate 1, a semiconductor layer 4 for photoelectric function, and a back electrode 5 layered in that order. The semiconductor layer 4 has portions 4a, 4b, 4c and 4d protracting beyond the overlapping region of the front electrode 3 and the back electrode 5.

Referring to FIG. 1B, the protracting portion 4d is indispensable for preventing a short circuit between a side surface 3s of the front electrode 3 and an extended portion 5s of the back electrode 5. However, the effectively functioning region of the sensor element LS is the region where the front electrode 3, the semiconductor layer 4 and the back electrode 5 overlap with one another. Accordingly, the other protruding portions 4a, 4b and 4c are essentially unnecessary. In the transparent photo detector device having this kind of light sensor elements LS dispersively disposed in an one-dimensional or two-dimensional manner, the protruding portions 4a, 4b and 4c are desired to be as small as possible in order to avoid decrease of the transparent region.

In an automatic focus detector device for a camera or the like, a number of light sensor elements must be arranged on a plane for properly sampling high frequency component in the brightness of an image of an object. In case where a number of light sensor elements are arranged in a transparent photo detector device, however, an area of each light sensor element must be smaller in order to prevent deterioration of the light transmissibility of the photo detector device. In that case, an output signal becomes small in proportion to the decrease of the area of the sensor element, so that S/N ratio is lowered in case where there is little amount o incident light.

In the transparent photo detector device, the passing light is desired to go straight without being influenced by refraction or scattering. In addition, in a photo detector device having a plurality of light sensor elements, it is desired that a defect in a certain sensor element or a disconnection at a certain point in the wire pattern does not influence other sensor elements.

SUMMARY OF THE INVENTION

It is an object of the present invention to improve the light transmissibility of a transparent photo detector device.

It is another object of the present invention to provide a method for manufacturing a transparent photo detector device with improved light transmissibility.

It is yet another object of the present invention to provide a transparent photo detector device with improved S/N ratio.

It is still another object of the present invention to provide a transparent photo detector device less susceptible to refraction or scattering.

It is still another object of the present invention to provide a transparent photo detector device in which a defect in one of a plurality of light sensor elements or a disconnection at a certain point of the wire pattern does not influence the other light sensor elements.

A transparent photo detector device according to an aspect of the present invention comprises: a transparent insulator substrate; a plurality of light sensor elements dispersively disposed on a main surface of the substrate, said sensor element including a transparent front electrode, a semiconductor layer for photo electric function and an opaque back electrode formed in that order on the main surface of the substrate, said semiconductor layer being neither protracting from nor retracting into between said front and back electrodes; and a transparent wire pattern formed on the main surface of the substrate for electrically connecting the plurality of sensor elements.

According to another aspect of the present invention, a method for manufacturing a photo detector device comprising a transparent insulator substrate and a plurality of light sensor elements, each of said sensor elements having a transparent front electrode, a semiconductor layer for photo electric function, and a opaque back electrode formed in that order on the substrate includes the step of removing a portion of the semiconductor layer protracting beyond the back electrode by etching.

A transparent photo detector device according to a further aspect of the present invention comprises: a transparent insulator substrate; a plurality of light sensor elements dispersively disposed and a wire pattern on a main surface of the substrate; a transparent protection plate for covering the light sensor elements and the wire pattern with a transparent adhesive; and external electrodes not covered by the transparent protection plate and formed on a region of the main surface of the substrate, wherein the wire pattern is connected to said external electrodes.

A transparent photo detector device according to yet another aspect of the present invention comprises: a transparent insulator substrate; a plurality of light sensor elements dispersively disposed and a wire pattern on a main surface of the substrate; a transparent insulator plate for covering the light sensor elements and the wire pattern with a transparent adhesive; and a transparent conductive film formed on the external surface of each of the substrate and the transparent insulator plate, connected to the ground potential.

A transparent photo detector device according to still another aspect of the present invention comprises: a transparent insulator substrate; a plurality of light sensor elements dispersively disposed on a main surface of the substrate; a collector electrode formed on the peripheral portion of the main surface of the substrate for surrounding the sensor elements; and a wire pattern formed on the main surface for connecting each of the sensor elements to the collector electrode through a plurality of paths.

These object and other objects, features, aspects and advantages of the present invention will become more apparent from the following detailed description of the present invention when taken in conjunction with the accompanying drawings.

BRIEF DESCRIPTION OF THE DRAWINGS

FIG. 2 is a perspective view illustrating a part of a transparent conductive pattern consisting of front electrodes and lead wires.

FIG. 5A is a rear perspective view illustrating a part of a photo detector device according to another embodiment of the present invention.

FIG. 5B is a cross sectional view taken along a line 5B—5B in FIG. 5A.

FIG. 5C is a cross sectional view taken along a line 5C—5C in FIG. 5A.

FIGS. 10A to 10D illustrate patterns employed in the manufacturing process of the transparent photo detector device of FIG. 8A, in which FIG. 10A shows a transparent conductive pattern; FIG. 10B shows an insulator layer pattern; FIG. 10C shows a semiconductor layer pattern; and FIG. 10D shows a metal layer pattern.

The same reference numerals in the figures denote the same or like portions.

DETAILED DESCRIPTION OF PREFERRED EMBODIMENTS

Referring to FIG. 2, a pattern of a transparent conductive film used in the present invention is shown. A pattern of a transparent conductive oxide (TCO) such as $In_2O_3$, $SnO_2$ and ITO is formed on a main surface $1a$ of a transparent insulator substrate 1 of glass or the like. In this pattern, segments 2X parallel to the X axis and segments 2Y parallel to the Y axis are arranged in a matrix form. These segments 2X and 2Y are isolated from one another. Such a conductive pattern may be formed by a vacuum evaporation method, an electron beam evaporation method, a sputtering method, a spray method or a thermal CVD method for forming TCO layer on the entire main surface $1a$ of the insulator substrate 1, and by the following patterning with photolithography. A light sensor element is formed at each of cross regions 2XY where the segments 2X and 2Y cross with each other.

Figure 1A:
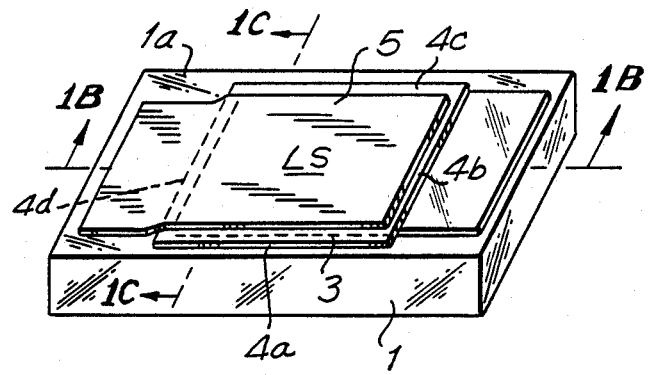
FIG. 1A is a rear perspective view of a conventional light sensor element.
Figure 1B:
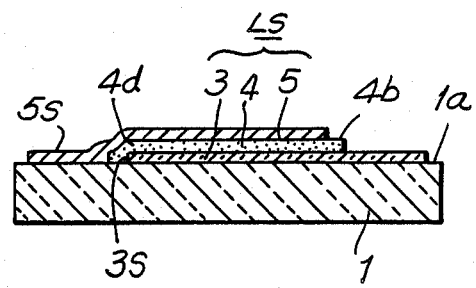
FIG. 1B is a cross sectional view taken along a line 1B—1B in FIG. 1A.
Figure 1C:
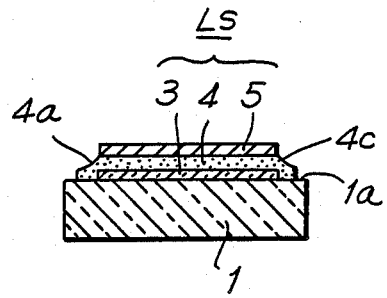
FIG. 1C is a cross sectional view taken along a line 1C—1C in FIG. 1A.
Figure 3A:
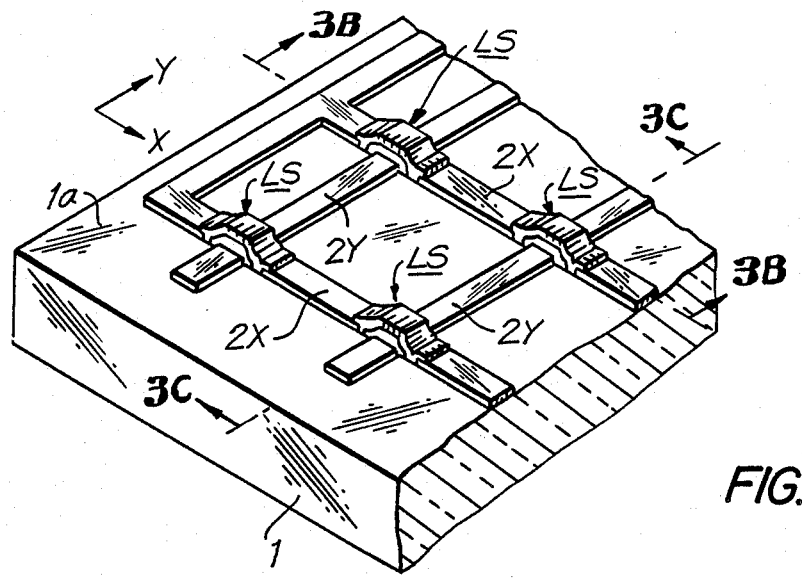
FIG. 3A is a rear perspective view illustrating a part of a photo detector device according to the present invention.
Figure 3B:
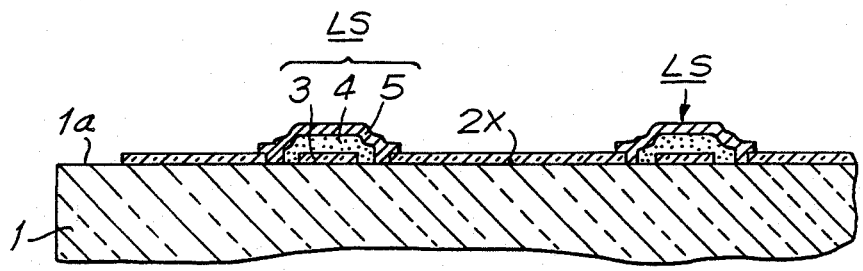
FIG. 3B is a cross sectional view taken along a line 3B—3B in FIG. 3A.
Figure 3C:
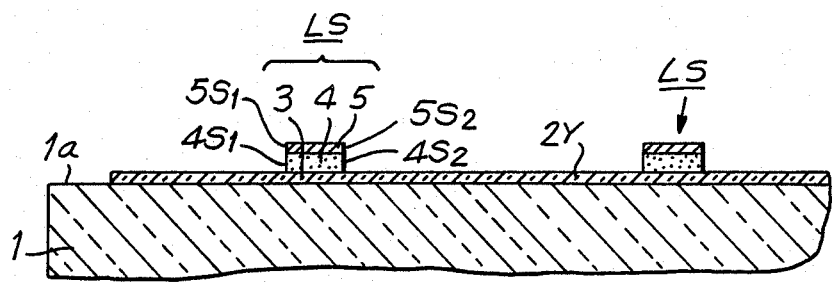
FIG. 3C is a cross sectional view taken along a line 3C—3C in FIG. 3A.

FIG. 3A shows an array of fine light sensor elements LS formed on the respective cross regions 2XY. FIGS. 3B and 3C are cross sectional views taken along a line 3B—3B and a line 3C—3C in FIG. 3A, respectively, illustrating the cross sectional structure of these light sensor elements. The cross region 2XY of the segment 2Y in the Y direction serves as a transparent front electrode 3, and then a semiconductor layer 4 for photo electric function and an opaque back electrode 5 of aluminum, titanium, silver, or chromium are formed on said front electrode 3 in this order.

The semiconductor layer 4 is formed of an amorphous silicon type semiconductor such as amorphous silicon, amorphous silicon carbide, amorphous silicon tin and amorphous silicon germanium obtained by an optical CVD method or a plasma CVD method using silicon compound such as silane ($SiH_4$) or silicon tetra fluoride ($SiF_4$) as source material. The semiconductor layer may be a photo conductive semiconductor whose resistance rapidly decreases by light irradiation through the transparent insulator substrate 1 and the front electrode 3, or it may be a photovoltaic cell having a p-i-n or p-n junction parallel to the front electrode for generating photovoltaic power.

The back electrode 5 covers the entire rear surface of the semiconductor layer 4, and the semiconductor layer 4 is neither protracting from nor retracting into between the front electrode 3 and the back electrode 5. Namely, sides $5S_1$, $5S_2$ of the back electrode 5 and sides $4S_1$, $4S_2$ of the semiconductor layer 4 coincide with each other, respectively.

Meanwhile, in the direction of the X axis, the back electrode 5 shortly extends over the semiconductor layer 4 to be connected to the neighboring conductive segments 2X.

Thus, a plurality of light sensor elements LS dispersively disposed in a 2-dimensional manner along the X and Y axes are electrically connected through a transparent conductive pattern 2X and 2Y. If the ratio of the total area of the dispersively disposed fine light sensor elements LS to the effective light receiving area of the photo detector device is less than about 10%, the existence of the sensor elements LS is hardly noticed even when the photo detector device is viewed from the rear surface. In case where the transparent photo detector device is viewed from the back side, there will exist undesired incident light from the back side. However, light from the direction of the back side can be shut out from the semiconductor layer 4 by just fully covering the semiconductor layer 4 with the back electrode 5 of an opaque metal material.

Figure 4A:
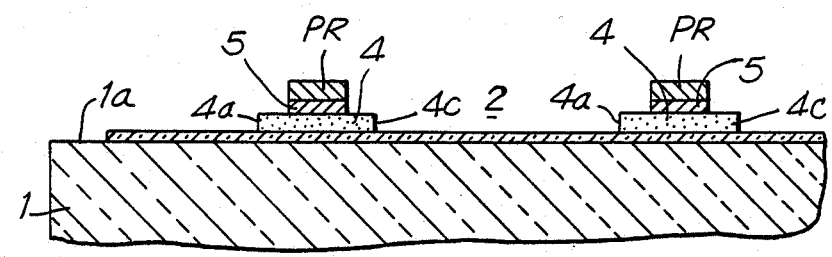
FIGS. 4A and 4B are cross sectional views showing the manufacturing process of the photo detector device according to the present invention.
Figure 4B:
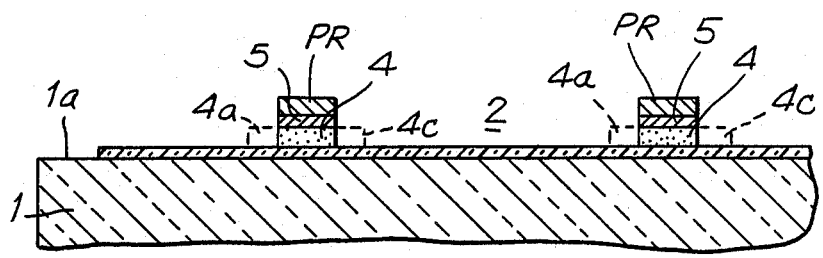

FIGS. 4A and 4B illustrate a method for making coincidence between the sides $5S_1$, $5S_2$ of the back electrode and the sides $4S_1$, $4S_2$ of the semiconductor layer 4, respectively, as shown in FIG. 3C. In these figures, the semiconductor layer 4 and the back electrode 5 are selectively formed by photolithography. Portions 4a and 4c protracting beyond the back electrode 5 are easily removed by, e.g., plasma etching in a $CF_4$ atmosphere, utilizing both a photo resist layer PR which has been used in the above photolithography and the back electrode 5 as a mask.

FIG. 5A shows an array of light sensor elements LS according to another embodiment of the present invention. FIGS. 5B and 5C are cross sectional views taken along lines 5B—5B and 5C—5C in FIG. 5A, respectively, illustrating cross sectional structure of a light sensor element according to this embodiment. The feature of the sensor element according to this embodiment resides in the structure of the back electrode 5. Namely, the back electrode 5 is composed of, from the side in contact with the substrate layer 4, a first metal layer $5_1$ including at least one of platinum (Pt), palladium (Pd), copper (Cu), aluminum (Al), chrome (Cr) and silver (Ag), a second metal layer $5_2$ including at least titanium (Ti) and a third metal layer $5_3$ including Al. If desired, a fourth or fifth metal layers may be further formed on the third metal layer $5_3$.

In shortly extending portions 5e of the back electrode 5 to be coupled with neighboring wire segments 2X of TCO, the aforementioned first metal layer $5_1$ is removed. Namely, in the extending portion 5e, the second metal layer 52 formed of chemically stable Ti or a Ti alloy such as TiAg is in contact with the wire segment 2X of TCO.

Generally, a photoresist film employed for etching a fine pattern such as the back electrode in a transparent photo detector device is of positive type. The developer of the positive type resist film is an alkaline solution, so that the interface between the TCO and Al layers will be corroded due to galvanic reaction caused by contact between different metals in the alkaline solution in case where the TCO wire segment and the Al layer of the back electrode are in direct contact with each other. However, in the back electrode shown in FIG. 5B, the corrosion at the interface between the back electrode and the TCO wire segment will not occur.

Figure 6A:
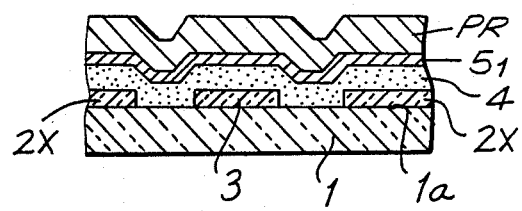
FIGS. 6A to 6E are cross sectional views showing the manufacturing process of the light sensor element of FIG. 5B.

FIGS. 6A to 6E are cross sectional views illustrating the manufacturing process of the light sensor element shown in FIG. 5B. In FIG. 6A, a p-i-n semiconductor layer 4 of about 4000-8000Å thickness composed of hydrogenated amorphous silicon is formed on the entire main surface 1a of the insulator substrate 1 on which a wire pattern of segments 2X, 2Y is formed in advance. Next, a first metal layer $5_1$ composed of a thin Al film of about 500-2000Å thickness is formed by resistance-heating evaporation. Then, a positive type resist PR suitable for fine working is placed.

Figure 6B:
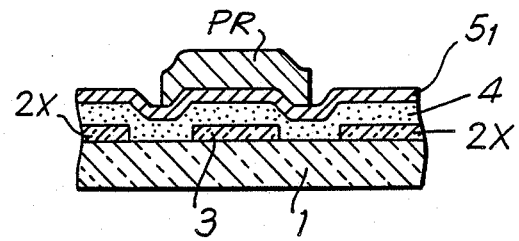

In FIG. 6B, after irradiation of ultraviolet rays through a photomask (not shown), the exposed portions are developed by a developer of alkaline solution to leave the positive type resist PR at the portions where light sensor elements LS are to be formed.

Figure 6C:
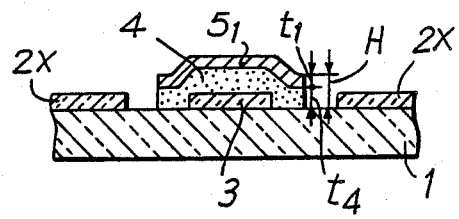

In FIG. 6C, portions of the first metal layer $5_1$ and the semiconductor layer 4, which are not covered by the positive type resist PR, are removed by dry etching with $BCl_3$ gas. Then the resist PR is removed by, for example, oxygen plasma.

Figure 6D:
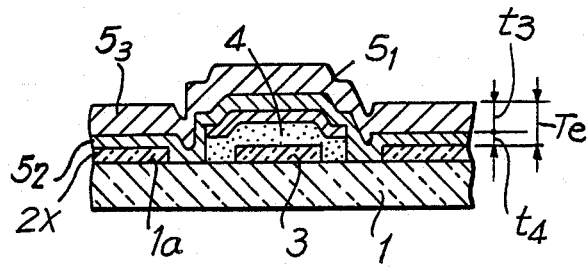

Then, as shown in FIG. 6D, a second metal layer $5_2$ of about 500-2000Å thickness formed of Ti is formed on the entire surface by an electron beam evaporation method or a sputtering method, and a third metal layer $5_3$ of a sufficient thickness formed of Al, which contributes to lower electric resistance of the electrode, is formed by resistance-heating evaporation.

During the process, it should be noted that the first metal layer $5_1$ of Al is formed prior to the formation of the second metal layer $5_2$ of Ti. Namely, the semiconductor layer 4 which easily suffers to physical damages due to the incoming Ti particles is protected by the soft first metal layer.

It should be further noted that the thickness Te of the extended portion 5e of the back electrode (in the present embodiment, sum of the thickness $t_2$ of the second metal layer $5_2$ and the thickness $t_3$ of the third metal layer $5_3$) is larger than the sum of the thickness $t_4$ of the semiconductor layer 4 and the thickness $t_1$ of the first metal layer $5_1$. Namely, if the film thickness Te of the extending portion 5e of the back electrode is smaller than a step H, that is, $t_4+t_1$, possibility of breaking of wire at the extending portion 5e of the back electrode due to the step H increases, resulting in decrease of yield in manufacturing; wherein the step H is a hazard at the even edges of the semiconductor layer 4 and the first metal layer $5_1$ which the extending portion 5e of the back electrode must go across when extending toward the wire segment 2X. Therefore, the thickness Te of the extending portion 5e is desired to be larger than $t_4+t_1$. As a result of an experiment of the inventors, it is confirmed that breaking of wire due to the step H does not occur in case where the thickness Te of the extending portion 5e is larger than about $1.5\times(t_4+t_1)$.

When the thickness Te of the extending portion 5e is increased, it is preferable that the thickness of the third metal layer $5_3$ of Al rather than the second metal layer $5_2$ of Ti is increased in order to simultaneously decrease electric resistance.

Figure 6E:
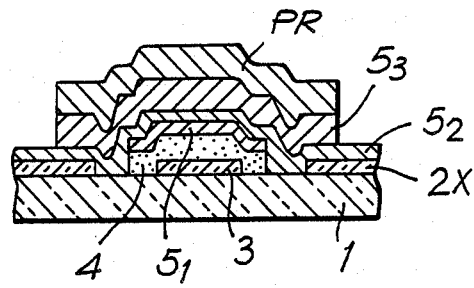

In FIG. 6E, the third metal layer $5_3$ is removed by etching with an etchant mainly composed of phosphoric acid, utilizing the positive type resist PR. Then, the exposed second metal layer $5_2$ is removed by dry etching using, for example, $CBrF_3$, and subsequently, the positive type resist PR is removed to complete the light sensor element of FIG. 5B. In case where the first metal layer $5_1$ and substrate layer 4 are protracting beyond the second metal layer $5_2$, the protracting portions may be removed by etching in similar manner as described with reference to FIGS. 4A and 4B.

Figure 7A:
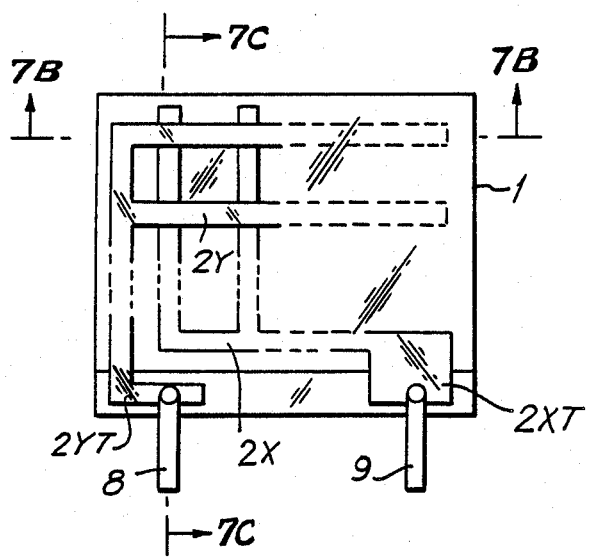
FIG. 7A is a front view of a transparent photo detector device according to yet another embodiment of the present invention.
Figure 7B:
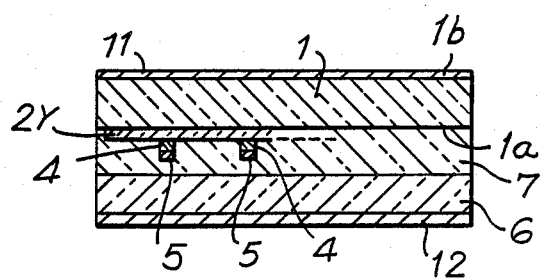
FIG. 7B is a cross sectional view taken along a line 7B—7B in FIG. 7A.
Figure 7C:
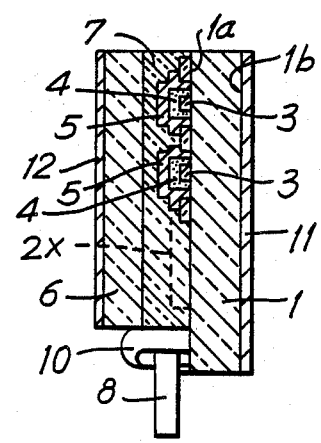
FIG. 7C is a cross sectional view taken along a line 7C—7C in FIG. 7A.

FIG. 7A shows a front view of a transparent photo detector device according to yet another embodiment of the present invention. FIGS. 7B and 7C illustrate cross sectional structure taken along lines 7B—7B and 7C—7C in FIG. 7A, respectively. In this embodiment, the back of the transparent photo detector device is covered with a transparent protection insulator plate 6 with a transparent adhesive 7 therebetween. The front surface and the rear surface of the transparent photo detector device are flat and parallel to each other so that refraction or scattering of the passing light is minimized.

TCO films 11 and 12 are formed on another main surface 1b of the substrate 1 and on the rear surface of the protection plate 6, respectively, these TCO films 11 and 12 being connected to the ground potential. These grounded transparent conductive films serve as shields for preventing an electrical interference such as an inductive coupling or a capacitive coupling of an output signal of the light sensor element with an external signal, which will appear as a noise in the output signal of the light sensor element.

External terminals 2XT and 2YT of the first wire 2X and the second wire 2Y are formed in a region on the main surface 1a where the substrate 1 is not covered by the protection plate 6. Electric conductors 8 and 9 are connected to these external terminals 2XT and 2YT to output electric signals externally. The connecting portions of the electric conductors 8, 9 and the external terminals 2XT, 2YT, respectively, are sealed with resin 10 as shown in FIG. 7C.

Figure 8A:
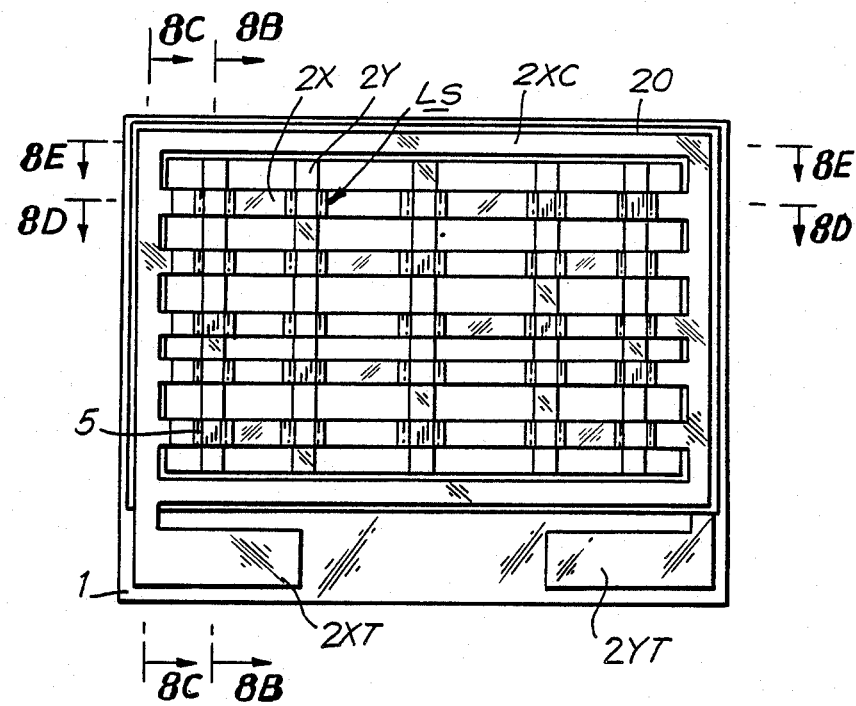
FIG. 8A is a rear view of a transparent photo detector device according to still another embodiment of the present invention.
Figure 8B:
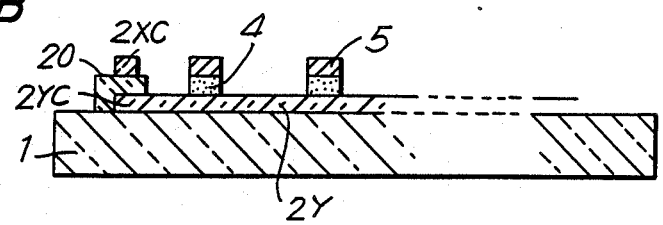
FIG. 8B is a cross sectional view taken along a line 8B—8B in FIG. 8A.
Figure 8C:
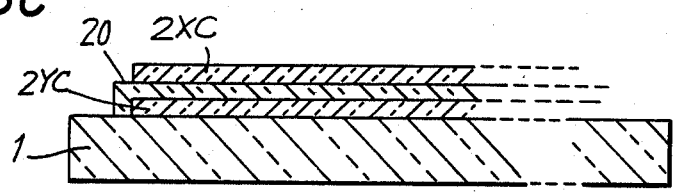
FIG. 8C is a cross sectional view taken along a line 8C—8C in FIG. 8A.
Figure 8D:
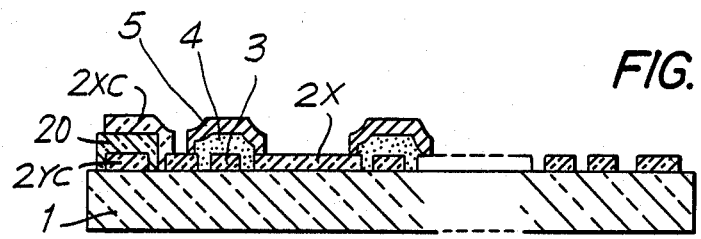
FIG. 8D is a cross sectional view taken along a line 8D—8D in FIG. 8A.
Figure 8E:
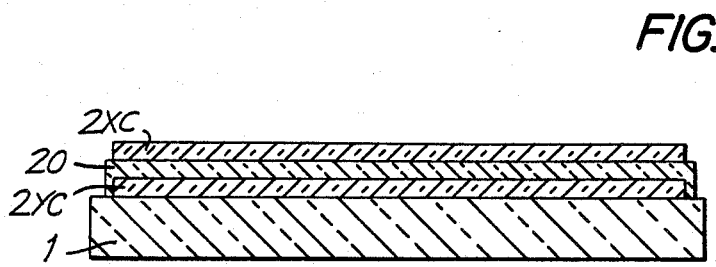
FIG. 8E is a cross sectional view taken along a line 8E—8E in FIG. 8A.
Figure 9:
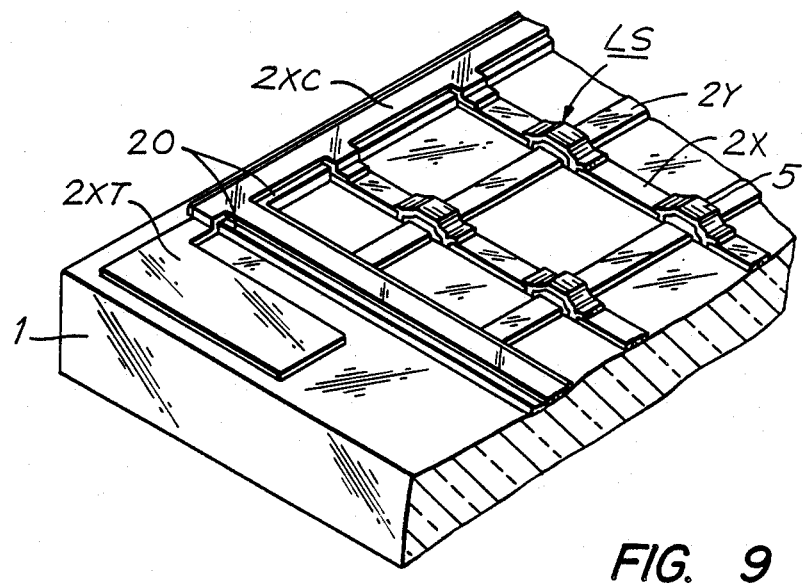
FIG. 9 is a rear perspective view showing a part of the transparent photo detector device of FIG. 8A.
Figure 10A:
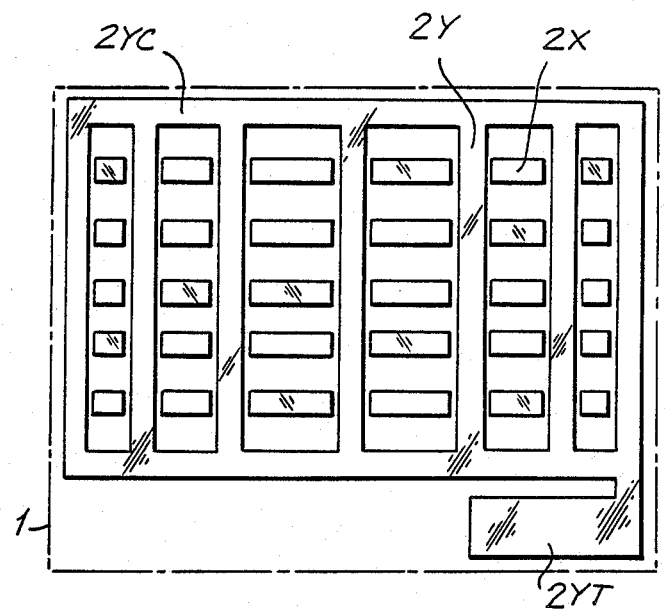
Figure 10B:
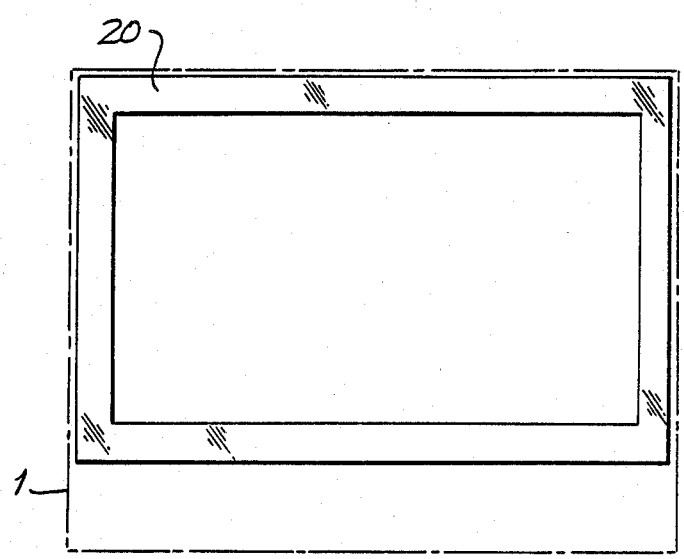
Figure 10C:
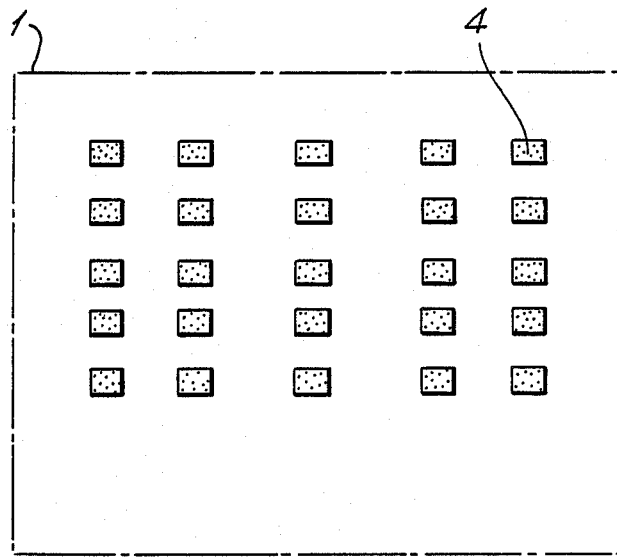
Figure 10D:
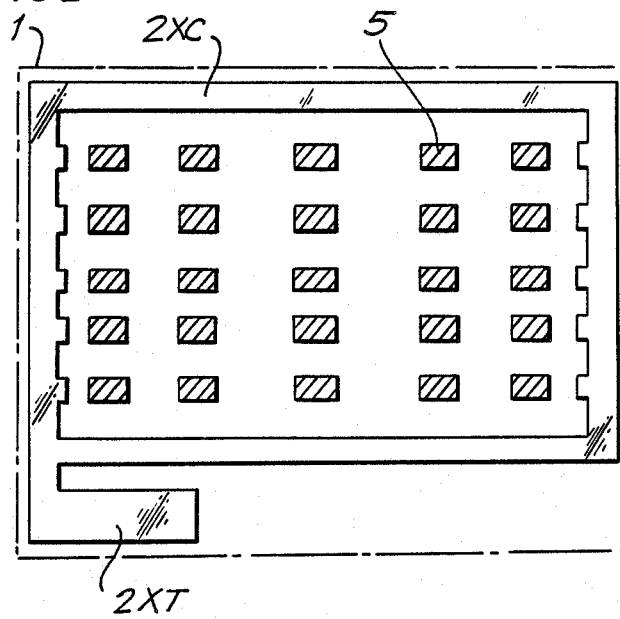

FIG. 8A schematically illustrates a rear view of a transparent photo detector device according to still another embodiment of the present invention. FIGS. 8B, 8C, 8D and 8E are cross sectional views taken along lines 8B—8B, 8C—8C, 8D—8D and 8E—8E, respectively. FIG. 9 is an enlarged perspective view illustrating a part of FIG. 8A. In the transparent photo detector device according to this embodiment, a TCO pattern shown in FIG. 10A is formed on the substrate 1; a pattern of an insulator layer 20 such as silicon nitride film, silicon oxide film and polyimide film, etc. shown in FIG. 10B is formed thereon; a pattern of a semiconductor layer 4 shown in FIG. 10C is formed thereon; and thereafter a pattern of a metal layer shown in FIG. 10D is formed. In the transparent photo detector device completed in this manner, each of the light sensor elements LS is connected through two paths to each of collector electrodes 2XC and 2YC. Therefore, even if a certain sensor element LS is defective and electrically short-circuited, the particular element can be separated by a laser for repairing the photo detector device. In addition, even if a wire is broken at a certain point, an electric signal from sensor elements LS can be outputted from the external terminals 2XT and 2YT through the collector electrode 20.

Although the present invention has been described and illustrated in detail, it is clearly understood that the same is by way of illustration and example only and is not be taken by way of limitation, the spirit and scope of the present invention being limited only by the terms of the appended claims.

What is claimed is:

1. A transparent photo detector device comprising:
a transparent insulator substrate;
a plurality of light sensor elements dispersively formed on a main surface of said substrate, said light sensor elements including a transparent front electrode, a semiconductor layer for photoelectric function and an opaque back electrode formed on the main surface of said substrate in this order, said semiconductor layer neither protracting from nor retracting into said front and back electrodes; and
a transparent wire pattern formed on the main surface of said substrate for electrically connecting said sensor elements.

2. The transparent photo detector device according to claim 1, wherein the ratio of the total area of said light sensor elements to the effective light receiving area of said transparent photo detector device is not more than about 10%.

3. The transparent photo detector device according to claim 1, wherein said back electrode includes at least one element selected from the group consisting of aluminum, copper, titanium, silver, chromium, palladium, gold and platinum.

4. The transparent photo detector device according to claim 1, wherein said back electrode comprises a first metal layer including at least one element selected from the group consisting of platinum, palladium, copper, aluminum, chromium and silver, a second metal layer including titanium, and a third metal layer mainly composed of aluminum in this order from the rear surface of said semiconductor layer.

5. The transparent photo detector device according to claim 4, wherein said back electrode has a short extending portion for connection with said wire, said first layer being removed from said extending portion, and said second layer being in contact with said wire.

6. The transparent photo detector device according to claim 5, wherein the thickness of said extending portion is larger than the sum of the thickness of said semiconductor layer and the thickness of said first metal layer.

7. The transparent photo detector device according to claim 6, wherein the thickness of said extending portion is more than about 1.5 times the sum of the thickness of said semiconductor layer and the thickness of said first metal layer.

8. The transparent photo detector device according to claim 1, wherein said semiconductor layer includes at least one composition selected from the group consisting of amorphous silicon, amorphous silicon carbide, amorphous silicon tin and amporphous silicon germanium.

9. The transparent photo detector device according to claim 1, wherein said light sensor element is a photovoltaic cell.

10. The transparent photo detector device according to claim 1, wherein said light sensor element is a photoconductive cell.

11. The transparent photo detector device according to claim 1, wherein said transparent front electrode and said wire pattern comprise compound selected from the group indium oxide and tin oxide.

* * * * *